United States Patent
Inamura et al.

(10) Patent No.: US 9,394,478 B2
(45) Date of Patent: Jul. 19, 2016

(54) PHOSPHOR, LED LIGHT-EMISSION ELEMENT, AND LIGHT SOURCE DEVICE

(71) Applicant: Mitsui Mining & Smelting Co., Ltd., Tokyo (JP)

(72) Inventors: Masaaki Inamura, Ageo (JP); Michiyo Inoue, Ageo (JP); Akinori Kumagai, Hida (JP); Haruka Shimizu, Ageo (JP); Takayoshi Mori, Ageo (JP); Jun-ichi Itoh, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 14/397,299

(22) PCT Filed: Oct. 22, 2013

(86) PCT No.: PCT/JP2013/078613
§ 371 (c)(1),
(2) Date: Oct. 27, 2014

(87) PCT Pub. No.: WO2014/065292
PCT Pub. Date: May 1, 2014

(65) Prior Publication Data
US 2015/0075611 A1    Mar. 19, 2015

(30) Foreign Application Priority Data

Oct. 23, 2012    (JP) ................. 2012-233616

(51) Int. Cl.
*C09K 11/02*    (2006.01)
*H01L 31/00*    (2006.01)
*H01L 31/055*    (2014.01)
*C09K 11/77*    (2006.01)
*H01L 33/50*    (2010.01)

(52) U.S. Cl.
CPC ............ *C09K 11/025* (2013.01); *C09K 11/7731* (2013.01); *H01L 31/055* (2013.01); *H01L 33/502* (2013.01); *H01L 33/507* (2013.01); *Y02E 10/52* (2013.01)

(58) Field of Classification Search
CPC ... H01L 31/055; H01L 33/507; H01L 33/502; C09K 11/025; C09K 11/7731
USPC ....... 136/257; 252/301.36, 301.6 S; 428/428, 428/446
See application file for complete search history.

(56) References Cited

U.S. PATENT DOCUMENTS

| 4,329,535 A * | 5/1982 | Rapp ............................. 136/259 |
| 2009/0057612 A1 | 3/2009 | Hosoba et al. |
| 2013/0256715 A1 * | 10/2013 | Itoh et al. ....................... 257/88 |

FOREIGN PATENT DOCUMENTS

| JP | 2002-080845 A | 3/2002 |
| JP | 2002-527570 A | 8/2002 |
| JP | 2003-041250 A | 2/2003 |
| JP | 2005-146190 A | 6/2005 |
| JP | 2005-162948 A | 6/2005 |
| JP | 2009-074080 A | 4/2009 |
| JP | 2010-215728 A | 9/2010 |
| WO | 2008102518 A1 | 8/2008 |
| WO | 2012032880 A1 | 3/2012 |
| WO | 2012077656 A1 | 6/2012 |

* cited by examiner

Primary Examiner — Tamir Ayad
(74) Attorney, Agent, or Firm — The Webb Law Firm

(57) ABSTRACT

Provided is a novel CaS-based phosphor with which chemical reactions can be inhibited even if said CaS-based phosphor is heated with a heterogeneous material. This phosphor includes: a crystalline parent material represented by the composition formula $Ca_{1-x}Sr_xS \cdot yZnO$ (in the formula, $0 \leq x<1$, $0<y \leq 0.5$); and a luminescent center.

14 Claims, 6 Drawing Sheets

PHOSPHOR, LED LIGHT-EMISSION ELEMENT, AND LIGHT SOURCE DEVICE

CROSS-REFERENCE TO RELATED APPLICATIONS

This application is the United States national phase of International Application No. PCT/JP2013/078613 filed Oct. 22, 2013, and claims priority to Japanese Patent Application No. 2012-233616 filed Oct. 23, 2012, the disclosures of which are hereby incorporated in their entirety by reference.

TECHNICAL FIELD

The present invention relates to a phosphor, and more particularly, the invention relates to a phosphor that can be used in light source apparatuses such as a white LED light source device, a vacuum fluorescent display (VFD), a field emission display (FED), and electroluminescence (EL), an LED light-emission element using the phosphor, and a light source device.

BACKGROUND ART

In the past, ZnCdS:Ag,Cl phosphor and the like have been mainly used as red phosphors, for the reason of being chemically stable or the like. However, the use of Cd has been restricted due to environmental problems, and the like, and new red phosphors that do not contain Cd have been developed.

For example, Patent Document 1 and Patent Document 2 disclose red phosphors containing calcium sulfide as a host material, Eu as a luminescent center (activator), and Mn, Li, Cl, Ce, Gd or the like as a sensitizer (co-activator).

Furthermore, Patent Document 3 discloses, as a red phosphor with which high color purity as well as satisfactory luminance and efficiency can be obtained even under low speed electronic excitation, a red phosphor represented by any one of general formulas: (Ca,Sr)S:Eu,A,F . . . (1), (Ca,Sr)S:Eu,Rb,F . . . (2), and (Ca,Sr)S:Eu,A,Rb,F . . . (3) (provided that A in the above formulas (1) to (3) contains at least one selected from Al, Ga and In at a content of 0.01 mol % to 5 mol %, and Rb at a content of 0.01 mol % to 2 mol %).

Patent Document 4 discloses a red phosphor represented by general formula: $(Ca_{1-x}Sr_x)S:Eu,In$ (provided that x in the formula represents 0 or 1), which contains In at a content of 0.05 mol % to 4.0 mol % relative to the total number of moles of Ca and Sr.

Patent Document 5 discloses an orange-colored phosphor that is excited by light in the region from near-ultraviolet to visible light, which has the same monoclinic crystalline structure as that of $Eu_2SiS_4$, and is characterized by being represented by general formula: $(CaBa)_{1-x}Eu_xSiS_4$ in which the Eu concentration is designated as x.

Patent Document 6 discloses, as a method for improving moisture resistance of a red phosphor based on alkaline earth metal sulfides such as strontium sulfide, barium sulfide and calcium sulfide, a method of dispersing red light emitting phosphor particles in an anhydrous polar solvent such as an alcohol, which contains a reactive fluoride at a low concentration, and thereby providing particles with a transparent fluoride coating.

CITATION LIST

Patent Document

Patent Document 1: JP 2002-80845 A
Patent Document 2: JP 2003-41250 A
Patent Document 3: JP 2005-146190 A
Patent Document 4: WO 2008/102518
Patent Document 5: JP 2010-215728 A
Patent Document 6: JP 1002-527570 W The CaS:Eu-based red phosphors disclosed in Patent Document 3 and Patent Document 4 display deep red color, and therefore, an excellent effect as phosphors can be expected.

However, on the other hand, a phosphor containing sulfur such as CaS (referred to as "CaS-based phosphor") is likely to react with water, and therefore, the phosphor has a problem that when the phosphor is stored or used in air, the phosphor reacts with the moisture in air or the like and is hydrolyzed, causing deterioration of the phosphor, and the luminescence intensity is decreased. Accordingly, it has been difficult to put the phosphor to practical use as, for example, a phosphor for LED, or the like.

Furthermore, there has been pointed out a problem in connection with the CaS-based phosphor that hydrogen sulfide gas is generated as a result of a reaction between the sulfur and water, and this hydrogen sulfide gas causes, particularly in a case in which the CaS-based phosphor is used in a white LED element, inhibition of curing of the silicone resin that is mixed with the phosphor; corrosion of metal members inside the element, such as an Ag plating film provided so as to increase the reflectance of the lead frame (hereinafter, referred to as "Ag reflective film"), followed by a decrease in the reflection performance; or electrical failure such as open circuits.

As one of the means for solving such problems, it may be considered to coat a CaS-based phosphor with a silica-based glass film having water vapor (gas) barrier properties. However, since a CaS-based phosphor is likely to undergo a chemical reaction (association) if heated together with a dissimilar material, when a silica-based glass film is formed, it is not possible for the CaS-based phosphor and the glass composition to react and form a homogeneous glass film, and it is also difficult to maintain luminescent characteristics.

In this case, a technique of adding a fusing agent ($B_2O_3$, an alkali metal or the like) in order to lower the softening point of glass may be considered; however, when a fusing agent of this kind is added, the reaction of the CaS-based phosphor is rather accelerated so that an opposite effect is generated.

Thus, in connection with the CaS-based phosphor, the present invention is to provide a new CaS-based phosphor which can suppress a chemical reaction even if heated together with a dissimilar material.

SUMMARY OF THE INVENTION

The present invention provides a phosphor containing a host material represented by composition formula: $Ca_{1-x}Sr_x$-S.yZnO (wherein 0≤x<1, and 0<y≤0.5), and a luminescent center.

EFFECT OF THE INVENTION

The CaS-based phosphor provided by the present invention includes a host material represented by composition formula: $Ca_{1-x}Sr_xS.yZnO$ (wherein 0≤x <1, and 0<y≤0.5), and is composed of, for example, (Ca,Sr)S and (Ca,Sr)ZnOS compositized together. When the CaS-based phosphor of the present invention is heated together with a dissimilar material, since (Ca,Sr)ZnOS exhibits a buffering action and works to suppress the reaction of (Ca,Sr)S, this (Ca,Sr)S and the dissimilar material reacting with each other can be suppressed. Accordingly, for example, even if the phosphor suggested by the present invention is heated together with a glass composition, since the phosphor reacting with the glass composition can be prevented, a homogeneous glass film can be formed on the phosphor particle surface, and moisture resistance can be improved. Furthermore, since luminescence characteristics can be maintained at that time, the CaS-based phosphor of the present invention can be suitably used in, for example, phosphors and light-emission elements used in light source devices such as white LED light sources, vacuum fluorescent displays (VFD), field emission displays (FED), and electroluminescence (EL), and light source devices.

DETAILED DESCRIPTION AND BEST MODE(S) FOR CARRYING OUT THE INVENTION

Hereinafter, embodiments of the present invention will be described in detail. However, the scope of the present invention is not intended to be limited to the embodiments described below.

<Present Phosphor 1>

The phosphor according to a first exemplary embodiment of the present invention (hereinafter, referred to as "present phosphor 1") is a phosphor containing a host material represented by composition formula (1): $Ca_xSr_xS \cdot yZnO$ (wherein $0 \leq x < 1$, and $0 < y \leq 0.5$), and a luminescent center.

In regard to composition formula (1), x that represents the molar ratio of Sr may be adjusted to an appropriate ratio in the range of $0 \leq x < 1$, based on the use of the final product or the design concept. For example, from the viewpoint of luminosity factor, x is preferably more than or equal to 0.5 but less than 1, and particularly more preferably more than or equal to 0.8 but less than 1. Furthermore, from the viewpoint of the purity of red color, x is preferably more than or equal to 0 but less than 0.5, and particularly more preferably more than or equal to 0 but less than 0.2.

In regard to $(Ca_{1-x}Sr_x)S$ of composition formula (1), the maximum emission wavelength (emission peak wavelength) can be adjusted by adjusting the content (x) of strontium. That is, since the maximum emission wavelength of CaS:Eu is 660 nm, and the maximum emission wavelength of SrS:Eu is 610 nm, the emission wavelength can be arbitrarily controlled to be between the maximum emission wavelengths (610 nm to 660 nm) by regulating the percentage contents of calcium and strontium.

Furthermore, y that represents the molar ratio of ZnO may be adjusted to the range of $0 < y \leq 0.50$ according to the use, and from the viewpoint of suppressing the reactivity of the present phosphor 1 with the glass composition and the like, y is more preferably more than or equal to 0.10, or less than or equal to 0.40, and particularly more preferably more than or equal to 0.15, or less than or equal to 0.35.

An example of the present phosphor 1 may be a compound having a configuration in which (Ca,Sr)S and (Ca,Sr)ZnOS are compositized.

With any compound having such a configuration, (Ca,Sr)ZnOS exhibits a buffering action, and (Ca,Sr)S reacting with a dissimilar material can be suppressed. For example, a reaction with a coating material that coats the present phosphor 1 can be suppressed, and there is no deterioration of the luminescence characteristics of the phosphor before and after coating, and a phosphor having high moisture resistance and high resistance to Ag corrosion can be obtained.

Here, (Ca,Sr)S includes compounds composed of Ca and S, compounds composed of Sr and S, and compounds composed of Ca, Sr and S.

(Ca,Sr)ZnOS includes compounds composed of Ca and ZnOS, compounds composed of Sr and ZnOS, and compounds composed of Ca, Sr and ZnOS. Preferably, (Ca,Sr)ZnOS includes compounds composed of CaZnOS, or compounds containing Sr as a portion of Ca of CaZnOS.

Figure 1:
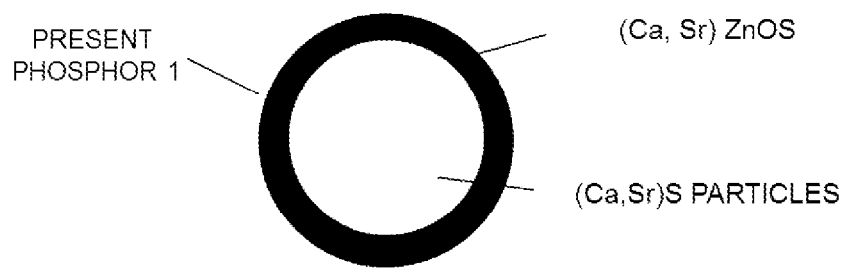
FIG. 1 is a diagram schematically illustrating an example of the cross-section state of a phosphor particle related to an embodiment of the present invention.

At this time, an example of the form of the relevant compositization may be a case in which, as illustrated in FIG. 1, a substance having a (Ca,Sr)ZnOS phase structure exists on the surface or in the vicinity of (Ca,Sr)S particles. Specifically, there may be a case in which a substance exists as a particle containing a substance having a CaZnOS phase structure, or a substance exists as a layer containing a substance having a CaZnOS phase structure on the surface or in the vicinity of the surface of (Ca,Sr)S particles.

In order to produce the present phosphor 1 having such a form, for example, the present phosphor 1 may be produced by co-precipitating CaO and ZnS in a non-water-based solvent in which (Ca,Sr)S particles are dispersed, evaporating the solvent, and then heating the residue at a temperature of 500° C. or higher in inert gas. However, the production method is not intended to be limited to this method.

Figure 2:
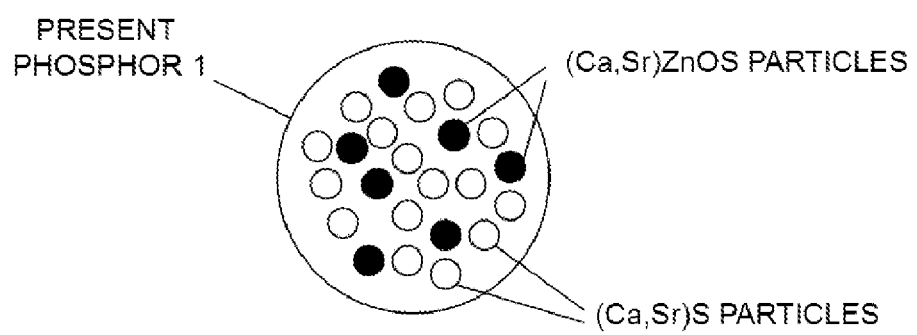
FIG. 2 is a diagram schematically illustrating an example of the cross-section state of a phosphor particle related to an embodiment of the present invention that is different from FIG. 1.

Furthermore, another example of form of the compositization may be a case in which, for example, as illustrated in FIG. 2, (Ca,Sr)S particles and particles having a (Ca,Sr)ZnOS phase structure exist in mixture and form aggregated particles.

In order to produce the present phosphor 1 having such a form, for example, the present phosphor 1 may be produced by heating a powder obtained by mixing (Ca,Sr)S particles and ZnO particles at a temperature of 500° C. or higher in inert gas. However, the production method is not intended to be limited to this method.

The host material of the present phosphor 1 may contain a substance having a ZnS phase structure.

At this time, examples of the form in which the substance having a ZnS phase structure exists include a state in which the substance exists as particles containing a substance having a ZnS phase structure, and a state in which the substance exists as a layer containing a substance having a ZnS phase structure.

The luminescent center of the present phosphor 1 is preferably divalent $Eu^{2+}$. In the case of trivalent ($Eu^{3+}$), since Eu is not solid solubilized into the host material, and there is a possibility that red color luminance may be decreased, the luminescent center is preferably divalent $Eu^{2+}$.

The percentage content of Eu is preferably 0.01 mol % to 5.0 mol % with respect to the host material, and among them, the percentage content is particularly preferably more than or equal to 0.05 mol %, or less than or equal to 2.0 mol %.

The present phosphor 1 may be a powder, or may be a molded body.

In the case of a powder, from the viewpoint of dispersibility, the median particle size (D50) based on the volume-based particle size distribution obtainable by analyzing by a laser diffraction scattering type particle size distribution analysis method, is preferably 0.1 µm to 100 µm, more preferably more than or equal to 1 µm or less than or equal to 50 µm, and particularly preferably more than or equal to 2 µm or less than or equal to 20 µm. When the value of D50 is more than or equal to 0.1 µm, there is no tendency of a decrease in the luminescence efficiency, and phosphor particles do not undergo aggregation. Furthermore, when the value of D50 is 100 µm or less, dispersibility is maintained, and coating unevenness or blocking of a dispenser or the like can be prevented.

Meanwhile, since the median particle size (D50) of the present phosphor 1 can be adjusted by adjusting the particle size of the raw material of the host material, that is, a Ca raw material, the median particle size may be adjusted according to the use.

(Production Method)

Next, a preferred example of the production method for the present phosphor 1 will be explained. However, the production method is not intended to be limited to the production method described as follows.

The present phosphor 1 can be produced by, for example, mixing a Ca raw material, a Sr raw material, a Zn raw material and a Eu raw material, calcining the mixture in an inert gas atmosphere, and annealing the product as necessary.

Furthermore, the present phosphor 1 can also be produced by, for example, mixing a Ca raw material and a Sr raw material, subjecting the mixture to a drying treatment as necessary, subsequently calcining the mixture in a hydrogen sulfide gas atmosphere, subsequently adding Zn and Eu raw materials thereto, calcining the mixture in an inert gas atmosphere, and annealing the product as necessary.

Moreover, for example, (Ca,Sr)S:Eu particles are produced by mixing a Ca raw material and a Sr raw material, subjecting the mixture to a drying treatment as necessary, subsequently subjecting the mixture to first calcination in a hydrogen sulfide gas atmosphere, subsequently adding a Eu raw material thereto, subjecting the mixture to second calcination in a reducing atmosphere, and annealing the product as necessary. Next, (Ca,Sr)S particles are mixed with ZnO particles, the mixture is calcined in an inert gas atmosphere and annealed as necessary, and thereby the present phosphor 1 can be produced.

Examples of the Sr raw material and the Ca raw material include simple metals, as well as oxides, sulfides, complex oxides, carbonates and the like of the respective metals; however, the Sr raw material and the Ca raw material are preferably sulfides.

Examples of the Eu raw material include europium compounds (Eu salts) such as EuS, $EuF_3$, $Eu_2O_3$, $Eu_2(C_2O_4)_3$, and Eu.

Fluorides of Al, Ga, Ba, In and the like may also be added to the raw materials. Since these fluorides melt in the calcination temperature range, the fluorides can promote sintering by a flux effect.

Mixing of the raw materials may be carried out by any of a dry method or a wet method.

In the case of dry mixing, the mixing method is not particularly limited, and for example, a raw material mixture may be obtained by mixing (for example, about 90 minutes) the raw materials with a paint shaker, a ball mill or the like using zirconia balls as media, and drying the mixture as necessary.

In the case of wet mixing, a dry raw material mixture may be obtained by preparing the raw materials in a suspension state using a non-water-based solvent, mixing the raw materials with a paint shaker, a ball mill or the like using zirconia balls as media as described above, subsequently separating the media using a sieve or the like, and removing the solvent from the suspension according to an appropriate drying method such as drying under pressure or vacuum drying.

Before calcining, if necessary, the raw material mixture obtained as described above may be subjected to pulverization, classification, and drying. However, it is not essentially necessary to carry out pulverization, classification, and drying.

Also, the powder thus obtained may be molded according to necessity. For example, the powder can be molded under the conditions of $\phi$ 20 mm and about 620 kg/cm².

For the first calcination, it is preferable to perform calcination at 700° C. to 1100° C. for 1 hour to 24 hours in a hydrogen sulfide gas atmosphere.

On the other hand, for the second calcination, it is preferable to perform calcination at 900° C. to 1300° C. for 1 hour to 24 hours in a reducing atmosphere or a non-oxidative atmosphere.

For the atmosphere of the second calcination, argon gas, nitrogen gas, hydrogen sulfide gas, a nitrogen gas atmosphere containing a small amount of hydrogen gas, or a reducing atmosphere such as a carbon dioxide atmosphere containing carbon monoxide can be employed. Among them, it is preferable to perform calcination in an inert gas atmosphere such as argon gas or nitrogen gas.

When the temperature of the second calcination is 900° C. or higher, even in a case in which a carbonate is used as a raw material, decomposition of carbon dioxide can be made to proceed sufficiently, and an effect of Eu diffusion into a CaS host material can be sufficiently obtained. On the other hand, when the temperature is 1300° C. or lower, abnormal grain growth is not likely to occur, and uniform fine particles can be obtained. Furthermore, when the calcination time is one hour or longer, reproducibility of material characteristics can be obtained, and when the calcination time is 24 hours or less, an increase in material scattering can be suppressed, and compositional fluctuations can be suppressed.

After the first calcination or the second calcination, the particle size may be adjusted by performing pulverization and classification as necessary.

Furthermore, after calcination or pulverization, annealing may also be carried out as necessary. At this time, regarding the annealing conditions, it is preferable to heat the particles to 400° C. to 1300° C. in an inert gas atmosphere such as argon gas or nitrogen gas, a hydrogen atmosphere, a hydrogen sulfide atmosphere, an oxygen atmosphere, or an air atmosphere.

<Present Phosphor 2>

The phosphor according to a second exemplary embodiment of the present invention (hereinafter, referred to as "present phosphor 2") is a phosphor including a glass coating layer on the particle surface of the present phosphor 1.

(Glass Coating Layer)

Figure 3:
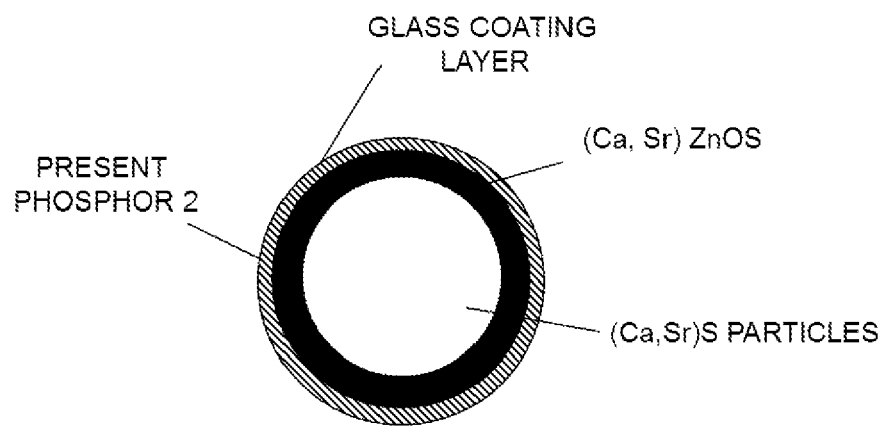
FIG. 3 is a diagram schematically illustrating an example of the cross-section state in which a glass film has been formed on the surface of the phosphor particle shown in FIG. 1.
Figure 4:
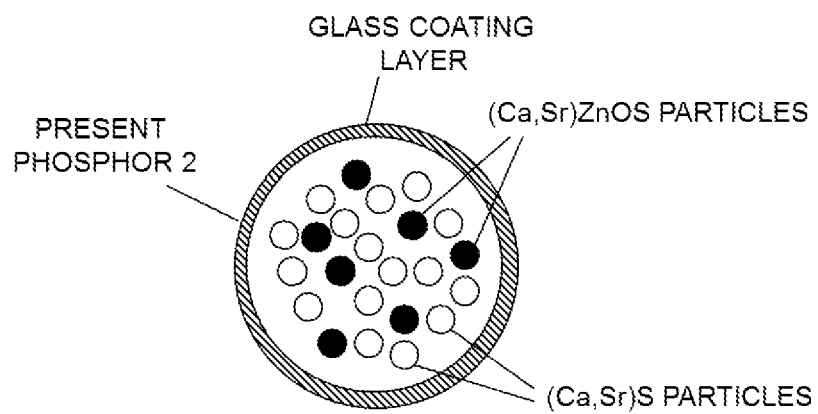
FIG. 4 is a diagram schematically illustrating an example of the cross-section state in which a glass film has been formed on the surface of the phosphor particle shown in FIG. 2.

The glass coating layer may be any layer containing a glass composition, as illustrated in FIG. 3 and FIG. 4.

Acceptable examples of the form of the present phosphor 2 having a glass coating layer include, for example, a form in which a glass coating layer is provided on the surface of the present phosphor 1; a form in which a metal oxide is present on the surface of the present phosphor 1, and a glass coating layer is provided so as to coat this metal oxide; and a form in which a glass coating layer is formed on the surface of the present phosphor 1, and a metal oxide layer is formed on the surface of the glass coating layer.

Furthermore, it is also acceptable to configure the coating layer provided to the present phosphor 1 into three or more layers, employing a glass coating layer as any one of the layers, and a metal oxide layer as another arbitrary layer.

Examples of the metal oxide contained in the metal oxide layer include oxides of silicon, magnesium, aluminum, gallium, zinc, titanium, boron, strontium, calcium, barium, tin, phosphorus, yttrium, zirconium, gadolinium, indium, lutetium, and lanthanum. These oxides may exist in a crystallized state, or may also exist in a vitrified state.

Such metal oxides have a feature that they react with hydrogen sulfide gas, and a feature that they do not absorb the light of LED or the like and do not affect the color, in other words, they are white and transparent.

The metal oxides described above can reduce the influence of hydrogen sulfide gas, if the metal oxides exist as metal oxide fine particles such as ZnO compound fine particles, on the surface of a sulfur-containing phosphor. In this case, it has been confirmed that it is not necessary for the metal oxide particles to coat the surface of a sulfur-containing phosphor as a metal oxide layer in which the metal oxide particles are continuously connected. Therefore, it does not matter even if there are areas where the metal oxide is not attached to the surface of the sulfur-containing phosphor.

However, it is definitely allowable to have the metal oxide particles coated on the surface of the sulfur-containing phosphor as a metal oxide layer in which the metal oxide particles are continuously connected, and this is a preferred embodiment. Meanwhile, such a metal oxide layer may also contain components other than the relevant metal oxide particles.

Furthermore, it is preferable that the metal oxide and the sulfur of the phosphor are not chemically bonded. It is because if these components are chemically bonded, the reaction with hydrogen sulfide gas is inhibited. Therefore, it is desirable for the metal oxide to be physically attached to the surface of the sulfur-containing phosphor.

Among the metal oxides described above, from the viewpoints of the reactivity with hydrogen sulfide gas and the property of not absorbing the light of LED or the like and having no influence on the color, zinc oxide, that is, a ZnO compound containing Zn and O is particularly preferred.

In regard to the ZnO compound, the specific composition thereof is not intended to be limited. For example, crystalline fine particles of one kind or two or more kinds selected from the group consisting of ZnO, $Zn(OH)_2$, $ZnSO_4 \cdot nH_2O$ ($0 \leq n \leq 7$), $ZnAl_2O_4$, and $ZnGa_2O_4$ may be used, and fine particles having compositions other than those may also be used.

In addition, an organic zinc salt such as zinc stearate may also be used.

Any glass coating layer may be used as long as it contains a glass composition, and for example, a layer formed from a glass composition containing a $SiO_2$-containing amorphous oxide is acceptable. Examples include glasses having compositions such as $SiO_2$, $Ma_2O_3$—$SiO_2$, and $Mc_2O$-$MbO$-$Ma_2O_3$—$SiO_2$ (wherein Ma represents a Group IIIA metal of aluminum group or a Group IIIB metal of rare earth group, such as B or Al; Mb represents an alkaline earth metal or Zn; and Mc represents an alkali metal), but the invention is not intended to be limited to these.

The glass coating layer may contain $B_2O_3$, an alkali metal, an alkaline earth metal, fluorine or a fluoride, as a component for lowering the softening point or the glass transition temperature of the glass composition. Furthermore, regarding the fluoride, the glass coating layer may preferably contain fluorides of one kind or two or more kinds selected from the group consisting of Ca, Sr, Ba, Mg, Zn, Al and Ga, and more preferably, the glass coating layer may contain fluorides of one kind or two or more kinds selected from the group consisting of Ca, Sr, Ba and Mg; however, the invention is not intended to be limited to these.

As an example of the glass coating layer, a glass coating layer can be formed on the surface of phosphor particles by dispersing glass particles in ethanol, and then evaporating ethanol.

At this time, a preferred example of the composition range of the glass composition, for example, glass particles, may be a composition containing, as molar ratios, Si=0.45 to 0.55, Ba=0.07 to 0.16, B=0.13 to 0.21, Al=0.11 to 0.20, and F=0.03 to 0.10. More preferably, a composition containing, as molar ratios, Si=0.48 to 0.51, Ba=0.10 to 0.13, B=0.16 to 0.18, Al=0.14 to 0.17, and F=0.04 to 0.08 may be used.

As an example of a specific production method for glass particles, for example, the glass particles can be obtained by mixing $SiO_2$, BaO, $B_2O_3$ and $Al_2O_3$ as main raw materials, with at least one selected from $BaF_2$, $AlF_3$, $Na_3AlF_6$ and $(NH_4)_3AlF_6$ as a fluorine-adding component, heating a mixture thus obtained in a temperature range of 1050° C. to 1400° C. for 30 minutes to 120 minutes, rapidly cooling the mixture in air or in water, and pulverizing the glass composition thus obtained to a particle size of 1 μm or less. At this time, there are no particular limitations on the pulverization method. For example, pulverization can be carried out by a dry method, a wet method, or a combination of these, and regarding the pulverization apparatus, for example, a vibrating mill, a bead mill, an attriter, a jet mill, and the like can be used in combination. However, the invention is not intended to be limited to such a production method.

Furthermore, the glass coating layer may also have the surface treated with an organic coupling agent.

Regarding the coating method for the glass coating layer, for example, coating may be carried out by preparing a precursor mixture including a precursor of the glass coating layer, water and a solvent; mixing the precursor mixture and phosphor particles; inducing a sol-gel reaction; coating the surface of the present phosphor 1 with glass; subsequently obtaining, by separation by filtration, only those phosphor particles having a glass coating layer formed thereon; and then drying and heat treating the phosphor particles.

Furthermore, it is also acceptable to obtain a glass coating layer by mixing particles of the present phosphor 1 and a powder of a glass composition; heat treating the mixture of the powder of the glass composition and the phosphor particles such that the powder of the glass composition melts and surrounds the phosphor particles, and then cooling the mixture.

In addition to that, a method of coating the surface of the phosphor particles according to a chemical gas phase reaction method, a method of attaching particles of a metal compound, or the like can also be employed.

It is more preferable that the glass coating layer be compact and continuous, in view of maintaining fluorescence of the phosphor. However, if the glass coating layer is compact and continuous, there may exist areas on a part of the surface of the phosphor in which the glass coating layer is not attached, and the phosphor surface is exposed.

With only one layer of the glass coating layer, corrosion of the Ag reflective film can be prevented; however, a combination layer with a metal oxide layer can also be formed on the surface of the phosphor. When a structure having two or more layers in combination is formed as such, the effect of suppressing corrosion of the Ag reflective film can be further increased.

<Analysis Method>

Whether a phosphor has the composition of the present phosphor 1 or 2 can be determined by analyzing the amounts of various elements using a fluorescent X-ray analyzer (XRF), or using an ICP emission analyzer by completely dissolving the phosphor in hydrochloric acid or the like.

<Optical Characteristics of Present Phosphors 1 and 2>

The present phosphors 1 and 2 can be produced to be excited by light having a wavelength in the ultraviolet region to the visible light region (about 250 nm to 610 nm), and particularly by light having a wavelength in the near-ultraviolet region to the blue region (about 300 nm to 510 nm), and to emit light in the visible light region, and particularly red light.

The present phosphors 1 and 2 can be produced such that the emission spectra of the present phosphors 1 and 2 have light emission peaks in the wavelength region of 610 nm to 660 nm as a result of excitation by light having a wavelength of about 300 nm to 610 nm.

<Use of Present Phosphors 1 and 2>

The present phosphors 1 and 2 can be suitably used as, for example, wavelength conversion materials for LED, laser, diodes, or the like. For example, a light-emission element or device, and a light source device can be configured by disposing the present phosphor 1 or 2 in the vicinity of the light emission source such as a LED, a laser or a diode, and the present phosphors can be used in various applications. For example, the present phosphor may be disposed on an LED so as to be brought into contact therewith directly or indirectly with a gluing agent or an adhesive interposed there between.

As such, when the present phosphors 1 and 2 are disposed in the vicinity of an LED, the present phosphors can be utilized in, for example, light devices and special light sources, as well as in the backlight of image display devices such as liquid crystal display devices. Furthermore, the present phosphors 1 and 2 can be utilized in display devices such as EL, FED and CRT by disposing an electric field source or an electron source in the vicinity of the present phosphors 1 and 2. The vicinity of a luminous body refers to a position at which the light emitted by the luminous body can be received.

More specifically, for example, a wavelength conversion type light-emission element including at least one LED chip and the present phosphor 2 can be configured such that the phosphor absorbs at least a portion of the light emitted from the LED, and light in which the light emitted from the LED and the light emitted from the phosphor are mixed is obtained. This can be utilized as a light-emission element for a light source device or an image display device.

A phosphor sheet which is in a sheet form and contains the present phosphors 1 and 2 and a transparent resin (referred to as "present phosphor sheet") can be produced using the present phosphors 1 and 2.

Since the present phosphors 1 and 2 are excited, as explained above, by light having a wavelength in the ultraviolet region to the visible light region (about 250 nm to 610 nm) and emit light in the visible light region, and particularly red light, for example, the present phosphor sheet can be obtained by mixing powders of the present phosphors with a yellow phosphor, adding this mixture to a colorless transparent resin, and molding the mixture into a sheet form. When this present phosphor sheet and a blue light emitting diode are combined, a light device displaying white color can be configured.

At this time, in order to adjust the color temperature and chromaticity of the light device, an oxynitride phosphor or a sulfide phosphor which emits green light or yellow light and has the Eu ions activated therein may be added. Furthermore, an oxynitride phosphor or a sulfide phosphor may also be added.

Furthermore, the color of light can be produced also by adjusting the thickness of the present phosphor sheet.

In regard to the thickness of the present phosphor sheet, if the thickness of the fluorescent sheet is smaller than 10 μm, since the amount of transmission of blue light emitted from a light emitting diode is increased, it is difficult to achieve color adjustment. On the contrary, if the thickness is larger than 50 mm, since the amount of transmission of blue light becomes extremely small, it is difficult to achieve color adjustment. From such a viewpoint, the thickness of the present phosphor sheet is preferably in the range of 10 μm to 50 mm, and the thickness is more preferably more than or equal to 50 μm, or less than or equal to 30 mm, and among them, more than or equal to 100 μm, or less than or equal to 20 mm.

Figure 7:
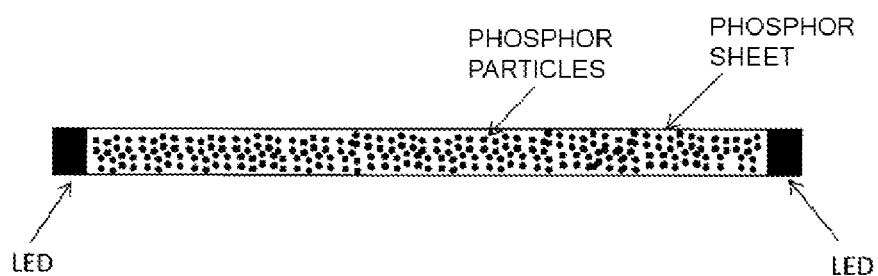
FIG. 7 is a schematic cross-sectional diagram illustrating an example of a lighting device produced using a phosphor sheet containing a phosphor and a transparent resin.

Regarding an exemplary form of the present phosphor sheet, for example, as illustrated in FIG. 7, a light source device can be configured by disposing light sources such as LED's along the end edges of both sides of the present phosphor sheet, and this can be used as, for example, a member of an image display device. At this time, a reflective sheet may be disposed on the back surface side (opposite side of the viewing side) of the present phosphor sheet.

Figure 8:
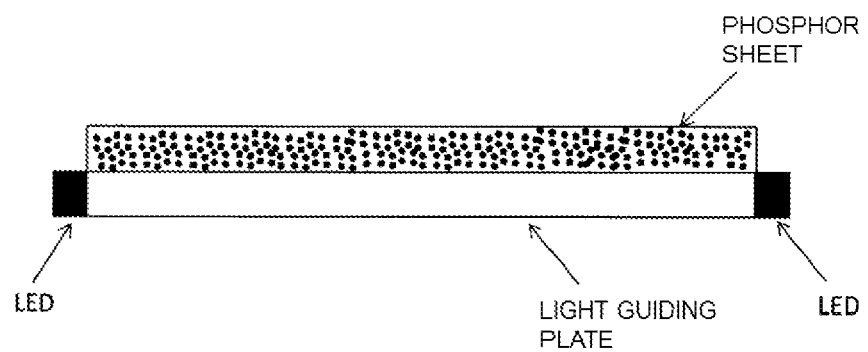
FIG. 8 is a schematic cross-sectional diagram illustrating another example of a lighting device produced using a phosphor sheet containing a phosphor and a transparent resin.
Figure 9:
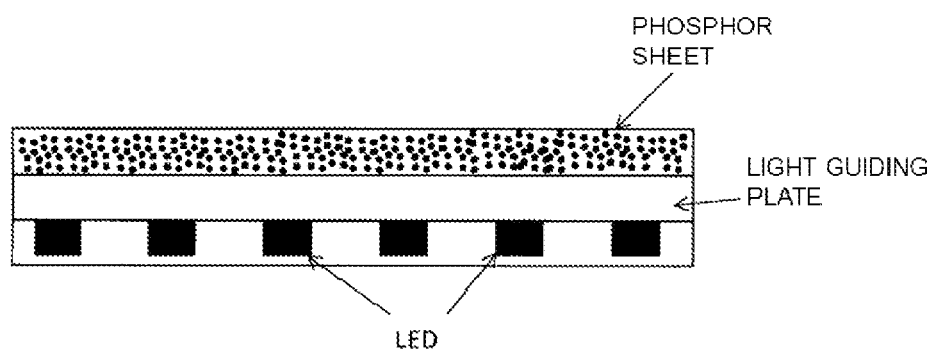
FIG. 9 is a schematic cross-sectional diagram illustrating still another example of a lighting device produced using a phosphor sheet containing a phosphor and a transparent resin.

Furthermore, as illustrated in FIG. 8 and FIG. 9, a light source device can be configured by disposing a light guide plate on the back surface side (opposite side of the viewing side) of the present phosphor sheet, and also disposing light sources such as LED's on the side or back surface side of this light guide plate, and this can be used as, for example, a member of an image display device.

Figure 10:
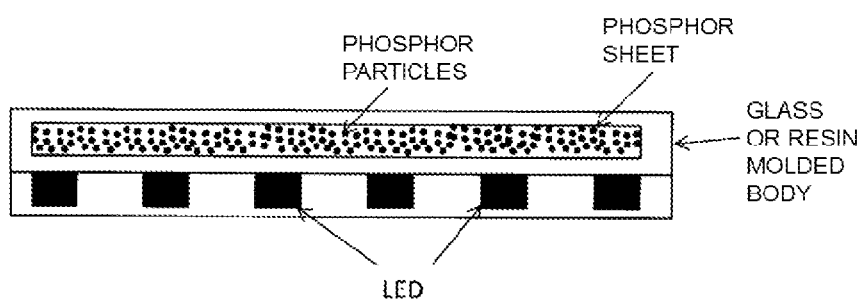
FIG. 10 is a schematic cross-sectional diagram illustrating still another example of a lighting device produced using a phosphor sheet containing a phosphor and a transparent resin.

Furthermore, as illustrated in FIG. 10, a light source device can be configured by forming a sealing layer formed from a transparent resin composition, a glass composition, or an inorganic/organic mixed material obtained by mixing these compositions, such that the sealing layer surrounds the present phosphor sheet, and disposing light sources such as LED's on the back surface side (opposite side of the viewing side) of the sealing layer, and this can be used as, for example, a member of an image display device. As such, when a sealing layer is formed so as to surround the present phosphor sheet, high reliability capable of withstanding the use in a severe environment of high temperature and high humidity can be imparted.

Figure 11:
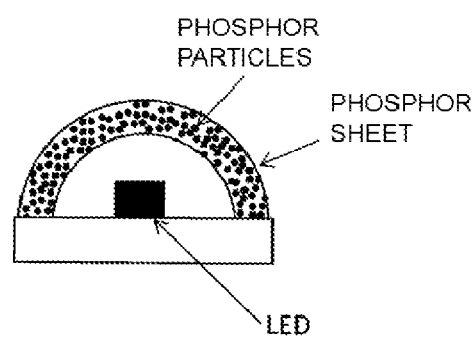
FIG. 11 is a schematic cross-sectional diagram illustrating still another example of a lighting device produced using a phosphor sheet containing a phosphor and a transparent resin.

Also, as illustrated in FIG. 11, a light source device can also be configured by forming a sealing layer formed from a transparent resin composition or a glass composition in a dome shape surrounding a light source such as an LED, and coating the present phosphor sheet so as to surround this sealing layer. At this time, the present phosphor sheet may be molded using a bent form as illustrated in FIG. 12, and thus any unevenness in the chromaticity or brightness can be suppressed.

Furthermore, an LED light-emission element including the present phosphor sheet as a wavelength conversion material can also be configured. A light source device can also be configured by mounting this LED light-emission element.

In addition, a phosphor molded body having a configuration in which a phosphor layer containing the present phosphors 1 and 2 is disposed in a sealing layer formed from a transparent resin composition or a glass composition, can also be produced.

Figure 12:
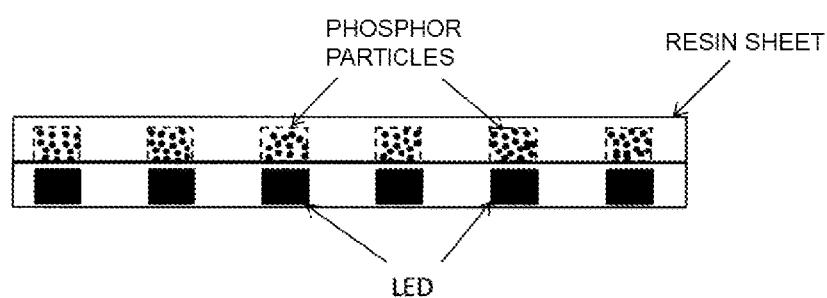
FIG. 12 is a schematic cross-sectional diagram illustrating an example of a lighting device having a configuration in which a phosphor layer containing a phosphor is disposed within a sealing layer formed from a transparent resin composition or a glass composition.

For example, as illustrated in FIG. 12, a phosphor molded body is formed, which has a configuration in which phosphor layers are formed by providing plural recessed grooves at appropriate intervals on the back surface side of a sheet body formed from a transparent resin composition or a glass composition, and embedding a phosphor-containing resin composition obtained by incorporating the present phosphors 1 and 2 in a transparent resin, into the respective recessed grooves. On the back surface side (opposite side of the viewing side) of the relevant phosphor molded body, light sources such as LED's are disposed on the back surface side of the respective phosphor layers. Thus, a light source device can be produced, and this can be used in an image display device or the like.

Furthermore, since the present phosphors 1 and 2 are excited, as explained above, by light having a wavelength in the ultraviolet region to the visible light region (about 250 nm to 610 nm) and emit light in the visible light region, and particularly red light, the present phosphors 1 and 2 can be utilized in solar power generation apparatuses by utilizing this characteristic.

For example, a solar power generation apparatus which has the present phosphors 1 and 2 that receive light including at least light in the ultraviolet region or light in the near-ultraviolet region in sunlight, and emits light in the visible light region; and a solar cell that receives light in the visible light region that has been emitted by the present phosphors 1 and 2 and converts the light to an electric signal, can be configured.

In the case of a solar cell formed from single crystal silicon or the like, it is general that although the solar cell is excited upon receiving light in the visible light region, the solar cell is not excited even upon receiving light in the ultraviolet region or light in the near-ultraviolet region. Therefore, the power generation efficiency can be increased by converting light in the ultraviolet region or light in the near-ultraviolet region to visible light by utilizing phosphors, and supplying the visible light to the solar cell.

Therefore, for example, a solar power generation apparatus including a filter mirror, the present phosphors 1 and 2, a semiconductor thermoelectric element, and a solar cell can be configured such that sunlight is spectrally dispersed by the filter mirror into the infrared region (for example, 1000 nm or more), the visible light/near-infrared region (for example, 450 nm to 1000 nm), and the ultraviolet/blue region (250 nm to 450 nm), the light of the infrared region is irradiated to a semiconductor thermoelectric element to heat the element, the relevant light of the ultraviolet/blue region is irradiated to the present phosphors 1 and 2 to be converted to light of the visible light region, and this light is irradiated to the solar cell together with the light of the visible light that has been spectrally dispersed by the filter mirror.

In this case, the phosphors can be formed by coating a light condensing surface or a heat collector pipe.

<Description of Terms>

The "light-emission element" according to the present invention is intended to mean a light emitting device that emits light and includes at least a phosphor such as a red phosphor, and a light emission source or an electron source as an excitation source. The "light emitting device" is intended to mean a light emitting device that emits relatively large-sized light and includes at least a phosphor and a light emission source or an electron source as an excitation source in a light-emission element. For both of them, the disposition of the phosphor inside an element or a device, or the positional relationship between the excitation source and the phosphor is not intended to be particularly limited. The "light emitting device" refers to a light emitting device which converts the light received by the phosphor from the excitation source, and utilizes the converted light.

According to the present invention, when the expression "X to Y" (X and Y represent arbitrary numbers) is used, unless particularly stated otherwise, the term includes the meaning of "X or more and Y or less" as well as the meaning of "preferably larger than X" and "preferably less than Y".

Furthermore, according to the present invention, when the expression "X or more" (X represents an arbitrary number) is used, unless particularly stated otherwise, the term includes the meaning of "preferably larger than X"; and when the expression "Y or less" (Y represents an arbitrary number) is used, unless particularly stated otherwise, the term includes the meaning of "preferably less than Y".

EXAMPLES

Examples of the present invention will be described below. However, the present invention is not intended to be construed to be limited to these Examples.

<Measurement of Internal Quantum Efficiency>

For the phosphor powders (samples) obtained in Examples and Comparative Examples, the internal quantum efficiency was measured as follows.

The internal quantum efficiency was calculated using a fluorescence spectrophotometer FP-6500 and an integrating sphere unit ISF-513 (manufactured by Jasco Co.) according to a solid quantum efficiency computational program. Meanwhile, the fluorescence spectrophotometer was calibrated using a substandard light source and Rhodamine B.

<Measurement of Ag Reflectance>

An Ag film specimen in which an Ag film having a thickness of about 300 nm was formed on a glass substrate by a sputtering method, a paste obtained by dispersing each of the phosphor powders (samples) obtained in Examples and Comparative Examples in a silicone resin (TSJ3150 manufactured by Momentive Performance Materials Inc.) at a concentration of 30 wt % (hereinafter, referred to as "phosphor resin") was applied on the Ag film of the Ag film specimen, and the paste was thermally cured for one hour at 140° C. This applied and cured sample was aged for 100 hours in an environment testing machine in a high-temperature and high-humidity atmosphere at 85° C. and 85% RH. After 100 hours, the sample was taken out, the phosphor resin was peeled off from the Ag film, and the reflectance of the Ag film surface was measured.

For the measurement of the reflectance, a fluorescence spectrophotometer FP-6500 was used. Regarding the reflectance, the reflectance of a $BaSO_4$ standard white plate was designated as 100% as a criterion.

The reflectance of the Ag film before the phosphor resin was applied was approximately 98%. In this regard, the reflectance of the Ag film after aging for 100 hours was measured, and the value was designated as the reflectance maintenance factor (%) after 100 hours.

<Evaluation of Moisture Resistance>

Each of the phosphor powders (samples) obtained in Examples and Comparative Examples was mixed with a silicone resin (OE-6630 manufactured by Dow Corning Toray Co., Ltd.) at a proportion of 40 wt %, the mixture was applied on a glass plate so as to have a thickness of about 300 μm, and the mixture was thermally cured at 140° C. for one hour. Subsequently, the luminescence efficiency before and after a HAST test was measured for the evaluation of moisture resistance of the phosphor.

The HAST test was carried out according to IEC68-2-66 so as to store the phosphor powder (sample) at 120° C. and 100% RH for 16 hours.

Regarding the luminescence efficiency, the external quantum efficiency (excitation wavelength 450 nm) was measured with FP-6500 manufactured by Jasco Co., and the maintenance factor (%) obtained when the external quantum efficiency before the HAST test was designated as 100%, was indicated as an evaluation value of for moisture resistance.

<Evaluation of Lumen Maintenance Factor of Phosphor>

A phosphor (sample) was mixed with a silicone resin (OE-6630 manufactured by Dow Corning Toray Co., Ltd.) at a proportion of 8 wt %, the mixture was potted into an LED package (6 mm) that used an Ag electrode, and the LED package was subjected to a heat effect at 140° C. for one hour. Subsequently, the LED was lit at a current of 60 mA, and the initial luminous flux (unit: Lm) was measured. The LED package with which measurement of the initial luminous flux was completed was aged for 1,000 hours in an environment testing machine in a high-temperature and high-humidity atmosphere at 85° C. and 85% RH, and the luminous flux was measured by the same method. This was expressed as the lumen maintenance factor (%) in the case of designating the initial luminous flux as 100%.

Example 1-1

A CaS powder, a SrS powder, a $EuF_3$ powder, and a ZnO powder as raw materials were respectively weighed to obtain a mass ratio of 13.00:86.25:0.75:20, and these were introduced into deionized water. The mixture was subjected to pulverization and mixing using a bead mill, and to a drying treatment, and then the mixture was calcined at 900° C. for 4 hours in an argon gas atmosphere. Thus, a phosphor powder (sample) represented by compositional formula: $Ca_{1-x}Sr_xS.yZnO:Eu$ (wherein x=0.8, y=0.27, and Eu: 0.4 mol %) was obtained.

This phosphor powder thus obtained was identified using an X-ray diffraction apparatus, and peaks of the (Ca,Sr)ZnOS phase and the ZnS phase were recognized.

Example 1-2

A phosphor powder (sample) represented by compositional formula: $Ca_{1-x}Sr_xS.yZnO:Eu$ (wherein x=0.8, y=0.27, and Eu: 0.4 mol %) was obtained in the same manner as in Example 1-1, except that a $Eu_2O_3$ powder was used instead of the $EuF_3$ powder.

Example 1-3

A phosphor powder (sample) represented by compositional formula: $Ca_{1-x}Sr_xS.yZnO:Eu$ (wherein x=0.8, y=0.27, and Eu: 0.4 mol %) was obtained in the same manner as in Example 1-1, except that a $Eu_2(C_2O_4)_3$ powder was used instead of the $EuF_3$ powder.

Example 1-4

A $CaCO_3$ powder and a $SrCO_3$ powder as raw materials were respectively weighed to obtain a mass ratio of 14.5:85.5, and these were introduced into deionized water. The mixture was subjected to pulverization and mixing using a bead mill, and to a drying treatment, and then the mixture was calcined at 900° C. for 2 hours in a hydrogen sulfide gas atmosphere. Thus, a phosphor host material powder was obtained.

Next, the phosphor host material powder, a $EuF_3$ powder, and a ZnO powder were respectively weighed to obtain a mass ratio of 99.25:0.75:20, and these were introduced into deionized water. The mixture was subjected to pulverization and mixing using a bead mill, and to a drying treatment, and then the mixture was calcined at 1100° C. for 4 hours in an argon gas atmosphere. Thus, a phosphor powder (sample) represented by compositional formula: $Ca_{1-x}Sr_xS.yZnO:Eu$ (wherein x=0.8, y=0.27, and Eu: 0.4 mol %) was obtained.

Figure 5:
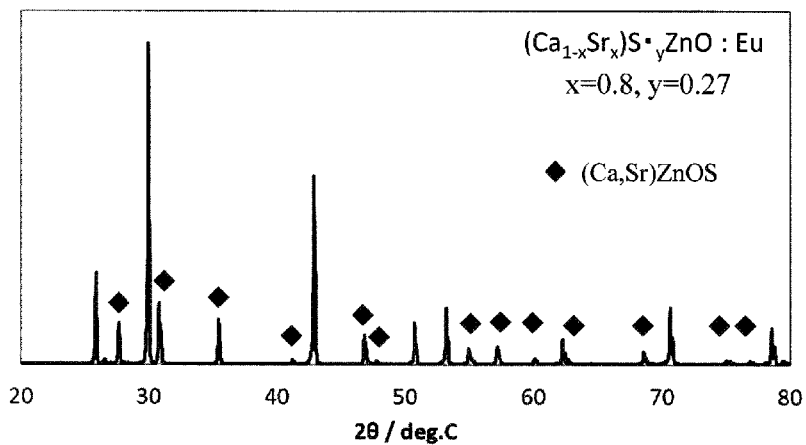
FIG. 5 is a diagram illustrating an X-ray diffraction pattern obtained by subjecting the phosphor powders obtained in Examples 1 to 4 to an X-ray diffraction analysis (CuKα)

This phosphor powder thus obtained was identified using an X-ray diffraction apparatus, and as illustrated in FIG. 5, peaks of the (Ca,Sr)ZnOS phase of the CaZnOS structure were recognized.

Example 1-5

A $CaSO_3$ powder and a $SrSO_3$ powder as raw materials were respectively weighed to obtain a mass ratio of 15.2:84.8, and these were introduced into deionized water. The mixture was subjected to pulverization and mixing using a bead mill, and to a drying treatment, and then the mixture was calcined at 700° C. for 4 hours in a hydrogen sulfide gas atmosphere. Thus, a phosphor host material powder was obtained.

Next, the phosphor host material powder, a $Eu_2O_3$ powder, and a ZnO powder were respectively weighed to obtain a mass ratio of 99.5:0.50:20, and these were introduced into deionized water. The mixture was subjected to pulverization and mixing using a bead mill, and to a drying treatment, and then the mixture was calcined at 1000° C. for 20 hours in an argon gas atmosphere. Thus, a phosphor powder (sample) represented by compositional formula: $Ca_{1-x}Sr_xS.yZnO:Eu$ (wherein x=0.8, y=0.27, and Eu: 0.4 mol %) was obtained.

Example 1-6

A CaS powder, a SrS powder, and a $EuF_3$ powder as raw materials were respectively weighed to obtain a mass ratio of 13.00:86.25:0.75, and these were introduced into deionized water. The mixture was subjected to pulverization and mixing using a bead mill, and to a drying treatment, and then the mixture was calcined at 900° C. for 4 hours in an argon gas atmosphere. Thus, a phosphor host material powder represented by general formula: $Ca_{1-x}Sr_xS:Eu$ (wherein x=0.8) was obtained.

Next, the phosphor host material powder and a ZnO powder were respectively weighed to obtain a mass ratio of 100:

20, and these were introduced into deionized water. The mixture was subjected to pulverization and mixing using a bead mill, and to a drying treatment, and then the mixture was calcined at 900° C. for one hour in a nitrogen atmosphere. Thus, a phosphor powder (sample) represented by compositional formula: $Ca_{1-x}Sr_xS.yZnO:Eu$ (wherein x=0.8, y=0.27, and Eu: 0.4 mol %) was obtained.

This phosphor powder thus obtained was identified using an X-ray diffraction apparatus, and peaks of the (Ca,Sr)ZnOS phase and the ZnS phase were recognized.

Example 1-7

A $SrS$ powder and a $EuF_3$ powder as raw materials were respectively weighed to obtain a mass ratio of 99.31:0.69, and these were introduced into deionized water. The mixture was subjected to pulverization and mixing using a bead mill, and to a drying treatment, and then the mixture was calcined at 900° C. for 4 hours in an argon gas atmosphere. Thus, a phosphor host material powder represented by general formula: SrS:Eu was obtained.

Next, the phosphor host material powder, a CaO powder, and a ZnO powder were respectively weighed to obtain a mass ratio of 89.51:10.49:20, and these were introduced into deionized water. The mixture was subjected to pulverization and mixing using a bead mill, and to a drying treatment, and then the mixture was calcined at 900° C. for 4 hours in an argon gas atmosphere. Thus, a phosphor powder (sample) represented by compositional formula: $Ca_{1-x}Sr_xS.yZnO:Eu$ (wherein x=0.8, y=0.27, and Eu: 0.4 mol %) was obtained.

Example 1-8

CaS, $AlF_3$, and $EuF_3$ as raw materials were respectively weighed to obtain a mass ratio of 98.40:0.46:1.14, and the mixture was mixed for 90 minutes in a paint shaker using zirconia balls having a diameter of ϕ 3 mm as media. Subsequently, the mixture was classified into a particle size of 100 μm or less, and was molded under the conditions of ϕ 20 mm and about 620 kg/cm². The resultant was further calcined at 1050° C. for 12 hours in an argon gas atmosphere, and thus a phosphor host material powder represented by formula: CaS:Eu,Al,F was obtained.

Next, the phosphor host material powder and a ZnO powder were respectively weighed to obtain a mass ratio of 100:20, and these were introduced into deionized water. The mixture was subjected to pulverization and mixing using a bead mill, and to a drying treatment, and then the mixture was calcined at 900° C. for one hour in a nitrogen atmosphere. Thus, a phosphor powder (sample) represented by compositional formula: $Ca_{1-x}Sr_xS.yZnO:Eu,Al,F$ (wherein x=0, y=0.17, and Eu: 0.4 mol %) was obtained.

This phosphor powder thus obtained was identified using an X-ray diffraction apparatus, and peaks of the (Ca,Sr)ZnOS phase and the ZnS phase were recognized.

Example 1-9

$CaCO_3$ and $BaCO_3$ were respectively weighed to obtain a mass ratio of 99.8:0.20, and these were introduced into deionized water. The mixture was subjected to pulverization and mixing using a bead mill, and to a drying treatment, and then the mixture was calcined at 850° C. for 4 hours in a hydrogen sulfide gas atmosphere. Next, $Eu_2O_3$ was added thereto, and the mixture was calcined at 1000° C. for 4 hours in an argon gas atmosphere. Thus, a phosphor host material powder represented by general formula: CaS:Eu,Ba was obtained.

Next, the phosphor host material powder and a ZnO powder were respectively weighed to obtain a mass ratio of 100:20, and these were introduced into deionized water. The mixture was subjected to pulverization and mixing using a bead mill, and to a drying treatment, and then the mixture was calcined at 900° C. for one hour in a nitrogen atmosphere. Thus, a phosphor powder (sample) represented by compositional formula: CaS.yZnO:Eu,Ba (wherein y=0.17, and Eu: 0.4 mol %) was obtained.

This phosphor powder thus obtained was identified using an X-ray diffraction apparatus, and peaks of the (Ca,Sr)ZnOS phase were recognized.

Example 1-10

CaS, EuS, and $In_2O_3$ were respectively weighed to obtain a mass ratio of 98.24:1.00:0.76, and the mixture was mixed for 90 minutes in a paint shaker using zirconia balls having a diameter of ϕ 3 mm as media. Subsequently, the mixture was classified into a particle size of 100 μm or less, and was molded under the conditions of ϕ 20 mm and about 620 kg/cm². The resultant was further calcined at 1050° C. for 12 hours in an argon gas atmosphere, and thus a phosphor host material powder represented by formula: CaS:Eu,In was obtained.

Next, the phosphor host material powder and a ZnO powder were respectively weighed to obtain a mass ratio of 100:20, and these were introduced into deionized water. The mixture was subjected to pulverization and mixing using a bead mill, and to a drying treatment, and then the mixture was calcined at 900° C. for one hour in a nitrogen atmosphere. Thus, a phosphor powder (sample) represented by compositional formula: CaS.yZnO:Eu,In (wherein y=0.17, and Eu: 0.4 mol %) was obtained.

Comparative Example 1-1

A CaS powder, a SrS powder, and a $EuF_3$ powder as raw materials were respectively weighed to obtain a mass ratio of 13.00:86.25:0.75, and these were introduced into deionized water. The mixture was subjected to pulverization and mixing using a bead mill, and to a drying treatment, and then the mixture was calcined at 900° C. for 4 hours in an argon gas atmosphere. Thus, a phosphor powder (sample) represented by general formula: $Ca_{1-x}Sr_xS:Eu$ (wherein x=0.8, and Eu: 0.4 mol %) was obtained.

Comparative Example 1-2

A $CaCO_3$ powder, a $SrCO_3$ powder, and a $Eu_2O_3$ powder as raw materials were respectively weighed to obtain a mass ratio of 14.4:85.1:0.5, and these were introduced into deionized water. The mixture was subjected to pulverization and mixing using a bead mill, and to a drying treatment, and then the mixture was calcined at 1100° C. for 20 hours in a hydrogen sulfide gas atmosphere. Thus, a phosphor powder (sample) represented by compositional formula: $Ca_{1-x}Sr_xS:Eu$ (wherein x=0.8, and Eu: 0.4 mol %) was obtained.

Comparative Example 1-3

A $CaSO_3$ powder, a $SrSO_3$ powder, and a $Eu_2O_3$ powder as raw materials were respectively weighed to obtain a mass ratio of 15.12:84.38:0.5, and these were introduced into deionized water. The mixture was subjected to pulverization and mixing using a bead mill, and to a drying treatment, and then the mixture was calcined at 700° C. for 4 hours in a hydrogen sulfide gas atmosphere, and was calcined at 1000° C. for 20 hours in an argon gas atmosphere. Thus, a phosphor powder (sample) represented by compositional formula: $Ca_{1-x}Sr_xS$:Eu (wherein x=0.8, and Eu: 0.4 mol %) was obtained.

Comparative Example 1-4

A $CaCO_3$ powder and a $SrCO_3$ powder as raw materials were respectively weighed to obtain a mass ratio of 14.5:85.5, and these were introduced into deionized water. The mixture was subjected to pulverization and mixing using a bead mill, and to a drying treatment, and then the mixture was calcined at 900° C. for 4 hours in a hydrogen sulfide gas atmosphere. Thus, a phosphor host material powder was obtained.

Next, the phosphor host material powder and a $EuF_3$ powder were respectively weighed to obtain a mass ratio of 99.25: 0.75, and these were introduced into deionized water. The mixture was subjected to pulverization and mixing using a bead mill, and to a drying treatment, and then the mixture was calcined at 1100° C. for 20 hours in an argon gas atmosphere. Thus, a phosphor powder (sample) represented by compositional formula: $Ca_{1-x}Sr_xS$:Eu (wherein x=0.8, and Eu: 0.4 mol %) was obtained.

Example 2-1

The phosphor obtained in Example 1-1, that is, a phosphor powder represented by compositional formula: $Ca_{1-x}Sr_x$-S.yZnO:Eu (wherein x=0.8, y=0.27, and Eu: 0.4 mol %), was added to ethanol and suspended therein. Deionized water and $Si(OEt)_4$ were added thereto, a small amount of aqueous ammonia was further added thereto as a catalyst, and the mixture was hydrolyzed at 60° C. Thus, a phosphor powder (sample) in which the phosphor obtained in Example 1-1 was coated with $SiO_2$ glass, was obtained.

The phosphor powder (sample) thus obtained was subjected to an ICP analysis, and the mass ratio of the phosphor component and the glass component ($SiO_2$) was found to be 100:5. Furthermore, for the phosphor powder (sample) thus obtained, the internal quantum efficiency, Ag reflectance, moisture resistance, and the lumen maintenance factor were measured as described above. The results are shown in Table 1.

Example 2-2

The phosphor obtained in Example 1-4, that is, a phosphor powder represented by compositional formula: $Ca_{1-x}Sr_x$-S.yZnO:Eu (wherein x=0.8, y=0.27, and Eu: 0.4 mol %), was added to ethanol and suspended therein. Deionized water, $Si(OEt)_4$, and $H_3BO_3$ were added thereto, a small amount of aqueous ammonia was further added thereto as a catalyst, and the mixture was hydrolyzed at 60° C. Thus, a glass precursor-phosphor complex in which a precursor gel of glass was coated on the phosphor surface, was synthesized. This glass precursor-phosphor complex was heat treated at 600° C. for 30 minutes, and thus a phosphor powder (sample) in which the phosphor obtained in Example 1-4 was coated with $B_2O_3$—$SiO_2$ glass, was obtained.

The phosphor powder (sample) thus obtained was subjected to an ICP analysis, and the mass ratio of the phosphor component and the glass components ($SiO_2$ and $B_2O_3$) was found to be 100:5. Furthermore, for the phosphor powder (sample) thus obtained, the internal quantum efficiency, Ag reflectance, moisture resistance, and the lumen maintenance factor were measured as described above.

The results are shown in Table 1.

Example 2-3

100 parts by mass of the phosphor obtained in Example 1-6, that is, a phosphor powder represented by compositional formula: $Ca_{1-x}Sr_xS.yZnO$:Eu (wherein x=0.8, y=0.27, and Eu: 0.4 mol %), was introduced into a pear-shaped flask together with 2 parts by mass of ZnO (average particle size: 30 nm) and 50 mL of ethanol, and ZnO was dispersed in ethanol using an ultrasonic cleaner. Deionized water, $Si(OEt)_4$, and $H_3BO_3$ were added thereto, and a small amount of aqueous ammonia was added thereto as a catalyst. The mixture was hydrolyzed at 60° C., and then ethanol was evaporated under stirring in an evaporator. Thus, a glass precursor-phosphor complex in which a precursor gel of glass was coated on the phosphor surface, was synthesized. The glass precursor-phosphor complex was heat treated at 600° C. for 30 minutes in order to vitrify this glass precursor-phosphor complex, and thus a phosphor powder (sample) in which the phosphor obtained in Example 1-6 was coated with ZnO—$B_2O_3$—$SiO_2$ glass, was obtained.

The phosphor powder (sample) thus obtained was subjected to an ICP analysis, and the mass ratio of the phosphor component and the glass components ($SiO_2$ and $B_2O_3$) was found to be 100:5. Furthermore, for the phosphor powder (sample) thus obtained, the internal quantum efficiency, Ag reflectance, moisture resistance, and the lumen maintenance factor were measured as described above. The results are shown in Table 1.

Example 2-4

100 parts by mass of the phosphor obtained in Example 1-8, that is, a phosphor represented by compositional formula: $Ca_{1-x}Sr_xS.yZnO$:Eu,Al,F (wherein x=0, y=0.17, and Eu: 0.4 mol %), was introduced into a pear-shaped flask together with 4.1 parts by mass of ZnO (average particle size: 20 nm), 2.5 parts by mass of $Al_2O_3$ (average particle size: 30 nm), and 50 mL of ethanol, and ZnO and $Al_2O_3$ particles were dispersed in ethanol using an ultrasonic cleaner. Deionized water, $Si(OEt)_4$, and $H_3BO_3$ were added thereto, and a small amount of aqueous ammonia was added thereto as a catalyst. The mixture was hydrolyzed at 60° C., and then ethanol was evaporated under stirring in an evaporator. Thus, a glass precursor-phosphor complex in which a precursor gel of glass was coated on the phosphor surface, was synthesized. This glass precursor-phosphor complex was heat treated at 600° C. for 30 minutes, and thus a phosphor powder (sample) in which the phosphor obtained in Example 1-8 was coated with $SiO_2$—$B_2O_3$—$Al_2O_3$ glass, was obtained.

The phosphor powder (sample) thus obtained was subjected to an ICP analysis, and the mass ratio of the phosphor component and the glass components ($SiO_2$ and $B_2O_3$) was found to be 100:5. Furthermore, for the phosphor powder (sample) thus obtained, the internal quantum efficiency, Ag reflectance, moisture resistance, and the lumen maintenance factor were measured as described above. The results are shown in Table 1.

Example 2-5

100 parts by mass of the phosphor obtained in Example 1-9, that is, a phosphor represented by compositional formula: $CaS.yZnO$:Eu,Ba (wherein y=0.17, and Eu: 0.4 mol %), was introduced into a pear-shaped flask together with 5 parts by mass of fluorinated aluminosilicate glass particles obtained by the production method described below, and 50 mL of ethanol, and glass particles were dispersed in ethanol using an ultrasonic cleaner. Subsequently, ethanol was evaporated under stirring in an evaporator, and thus glass-phosphor complex particles were obtained. These glass-phosphor complex particles were heat treated at 800° C. for 30 minutes, and thus a phosphor powder (sample) in which the phosphor obtained in Example 1-9 was coated with fluorinated aluminosilicate glass, was obtained.

The fluorinated aluminosilicate glass particles were obtained by, for example, preparing $SiO_2$, BaO, $B_2O_3$, $Al_2O_3$, and $BaF_2$ at a molar ratio of Si:Ba:B:Al:F=0.5:0.12:0.17: 0.15:0.06, heating the mixture prepared as such at 1200° C. for 60 minutes, rapidly cooling the mixture in air, and pulverizing the glass composition thus obtained to a particle size of 1 μm or less.

Comparative Example 2-1

The phosphor obtained in Comparative Example 1-1, that is, a phosphor powder represented by general formula: $Ca_{1-x}Sr_xS$:Eu (wherein x=0.8, and Eu: 0.4 mol %), was added to ethanol and suspended therein. Deionized water and $Si(OEt)_4$ were added thereto, a small amount of aqueous ammonia was further added thereto as a catalyst, and the mixture was hydrolyzed at 60° C. Thus, the phosphor obtained in Comparative Example 1-1 was coated with $SiO_2$ glass, and thereby a phosphor powder (sample) was obtained.

The phosphor powder (sample) thus obtained was subjected to an ICP analysis, and the mass ratio of the phosphor component and the glass component ($SiO_2$) was found to be 100:5. Furthermore, for the phosphor powder (sample) thus obtained, the internal quantum efficiency, Ag reflectance, moisture resistance, and the lumen maintenance factor were measured as described above. The results are shown in Table 1.

Comparative Example 2-2

The phosphor obtained in Comparative Example 1-1, that is, a phosphor powder represented by general formula: $Ca_{1-x}Sr_xS$:Eu (wherein x=0.8, and Eu: 0.4 mol %), was added to ethanol and suspended therein. Deionized water, $Si(OEt)_4$, and $H_3BO_3$ were added thereto, a small amount of aqueous ammonia was further added thereto as a catalyst, and the mixture was hydrolyzed at 60° C. Thus, a glass precursor-phosphor complex in which the precursor gel of glass was coated on the phosphor surface, was synthesized. This complex was heat treated at 600° C. for 30 minutes, and thus the phosphor obtained in Comparative Example 1-1 was coated with $B_2O_3$—$SiO_2$ glass. Thereby, a phosphor powder (sample) was obtained.

The phosphor powder (sample) thus obtained was subjected to an ICP analysis, and the mass ratio of the phosphor component and the glass components ($SiO_2$ and $B_2O_3$) was found to be 100:5. Furthermore, for the phosphor powder (sample) thus obtained, the internal quantum efficiency, Ag reflectance, moisture resistance, and the lumen maintenance factor were measured as described above. The results are shown in Table 1.

Comparative Example 2-3

100 parts by mass of the phosphor obtained in Comparative Example 1-2, that is, a phosphor powder represented by compositional formula: $Ca_{1-x}Sr_xS$:Eu (wherein x=0.8 and Eu: 0.4 mol %), was introduced into a pear-shaped flask together with 2 parts by mass of ZnO (average particle size: 30 nm) and 50 mL of ethanol, and ZnO was dispersed in ethanol using an ultrasonic cleaner. To this, 10 g of the glass precursor-phosphor complex of Example 2-2 before heat treatment was added, and ethanol was evaporated under stirring in an evaporator. Thus, a ZnO-deposited glass precursor-phosphor complex was obtained. This complex was heat treated at 600° C. for 30 minutes in order to vitrify the glass precursor, and thus the phosphor obtained in Comparative Example 1-2 was coated with ZnO—$B_2O_3$—$SiO_2$ glass. Thereby, a phosphor powder (sample) was obtained.

The phosphor powder (sample) thus obtained was subjected to an ICP analysis, and the mass ratio of the phosphor component and the glass components ($SiO_2$ and $B_2O_3$) was found to be 100:5. Furthermore, for the phosphor powder (sample) thus obtained, the internal quantum efficiency, Ag reflectance, moisture resistance, and the lumen maintenance factor were measured as described above. The results are shown in Table 1.

Comparative Example 2-4

100 parts by mass of the phosphor obtained in Comparative Example 1-3, that is, a phosphor powder represented by compositional formula: $Ca_{1-x}Sr_xS$:Eu (wherein x=0.8 and Eu: 0.4 mol %), was introduced into a pear-shaped flask together with 4.1 parts by mass of ZnO (average particle size: 20 nm), 2.5 parts by mass of $Al_2O_3$ (average particle size: 30 nm), and 50 mL of ethanol, and ZnO and $Al_2O_3$ particles were dispersed in ethanol using an ultrasonic cleaner. To this, 10 g of the glass precursor-phosphor complex of Example 2-2 before heat treatment was added, and ethanol was evaporated under stirring in an evaporator. Thus, a phosphor powder (sample) in which the phosphor obtained in Comparative Example 1-3 was hot blown with $SiO_2$—$B_2O_3$—$Al_2O_3$ glass, was obtained.

The phosphor powder (sample) thus obtained was subjected to an ICP analysis, and the mass ratio of the phosphor component and the glass components ($SiO_2$ and $B_2O_3$) was found to be 100:5. Furthermore, for the phosphor powder (sample) thus obtained, the internal quantum efficiency, Ag reflectance, moisture resistance, and the lumen maintenance factor were measured as described above. The results are shown in Table 1.

Comparative Example 2-5

A phosphor powder (sample) was obtained by coating glass in the same manner as in Example 2-5, except that the phosphor obtained in Comparative Example 1-1, that is, a phosphor represented by general formula: $Ca_{1-x}Sr_xS$:Eu (wherein x=0.8, and Eu: 0.4 mol %), was used.

Comparative Example 2-6

For the phosphor powder (sample) represented by compositional formula: $Ca_{1-x}Sr_xS$:Eu (wherein x=0.8, and Eu: 0.4 mol %) obtained in Comparative Example 1-4, the internal quantum efficiency, Ag reflectance, moisture resistance, and the lumen maintenance factor were measured as described above. The results are shown in Table 1.

TABLE 1

| | Core phosphor | Coating material | Internal quantum efficiency % | Ag reflectance 85° C./85% RH 100 h | Moisture resistance 120° C./100% RH 16 h | Lumen maintenance factor 85° C./85% RH 1,000 h |
|---|---|---|---|---|---|---|
| Example 2-1 | $(Ca_{1-x}Sr_x)S \cdot yZnO{:}Eu$ | $SiO_2$ | 72 | 70 | 85 | 90 |
| Example 2-2 | $(Ca_{1-x}Sr_x)S \cdot yZnO{:}Eu$ | $SiO_2$—$B_2O_3$ | 74 | 85 | 91 | 92 |
| Example 2-3 | $(Ca_{1-x}Sr_x)S \cdot yZnO{:}Eu$ | $SiO_2$—$B_2O_3$—$ZnO$ | 73 | 90 | 92 | 94 |
| Example 2-4 | $(Ca_{1-x}Sr_x)S \cdot yZnO{:}Eu$, Al, F | $SiO_2$—$B_2O_3$—$Al_2O_3$ | 75 | 92 | 91 | 94 |
| Example 2-5 | $(Ca_{1-x}Sr_x)S \cdot yZnO{:}Eu$, Ba | $SiO_2$—$BaO$—$B_2O_3$—$Al_2O_3$—F | 73 | 87 | 88 | 93 |
| Comparative Example 2-1 | $(Ca_{1-x}Sr_x)S{:}Eu$ | $SiO_2$ | 57 | 17 | 48 | 33 |
| Comparative Example 2-2 | $(Ca_{1-x}Sr_x)S{:}Eu$ | $SiO_2$—$B_2O_3$ | 42 | 38 | 50 | 40 |
| Comparative Example 2-3 | $(Ca_{1-x}Sr_x)S{:}Eu$ | $SiO_2$—$B_2O_3$—$ZnO$ | 43 | 56 | 45 | 45 |
| Comparative Example 2-4 | $(Ca_{1-x}Sr_x)S{:}Eu$ | $SiO_2$—$B_2O_3$—$Al_2O_3$ | 48 | 36 | 53 | 57 |
| Comparative Example 2-5 | $(Ca_{1-x}Sr_x)S{:}Eu$ | $SiO_2$—$BaO$—$B_2O_3$—$Al_2O_3$—F | 53 | 33 | 37 | 33 |
| Comparative Example 2-6 | $(Ca_{1-x}Sr_x)S{:}Eu$ | — | 76 | 13 | 0 | 20 |

As can be seen from Examples 2-1 to 2-5, it was found that a phosphor having a configuration in which (Ca,Sr)S and (Ca,Sr)ZnOS are compositized can have improved moisture resistance while maintaining luminescence characteristics. That is, when a phosphor of this kind is heated together with a dissimilar material, since (Ca,Sr)ZnOS exhibits a buffering action and works to suppress the reaction of (Ca,Sr)S, even if this phosphor is heated together with, for example, a glass composition, the phosphor can be prevented from reacting with the glass composition. Therefore, it was found that a homogeneous glass film can be formed on the phosphor particle surface, and can have improved moisture resistance.

Figure 6:
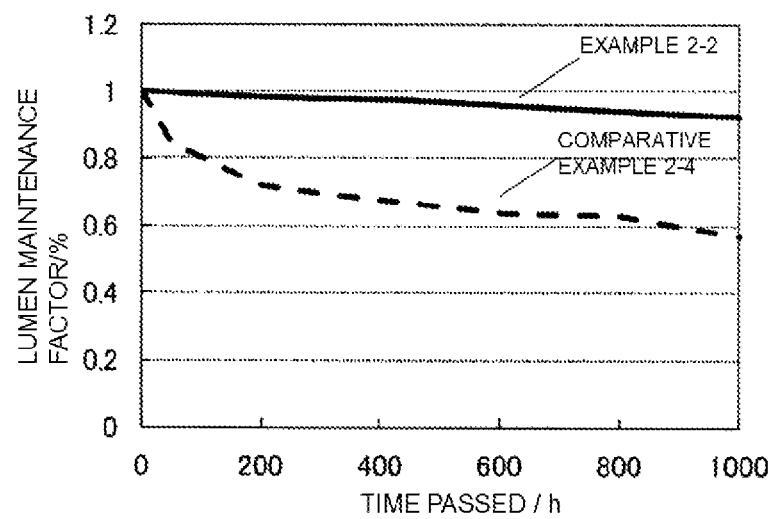
FIG. 6 is a graph illustrating the changes over time in the lumen maintenance factor (%) respectively evaluated for the phosphor powders obtained in Example 2-2 and Comparative Example 2-4, using LED packages.

FIG. 6 illustrates the changes over time in the lumen maintenance factor evaluated with LED packages for the phosphor powders obtained in Example 2-2 and Comparative Example 2-4.

Example 3

The phosphor powder obtained in Example 2-2 was added to polyether sulfone (PES) at a proportion of 20 wt %, and a fluorescent sheet having a thickness of 200 μm was produced using a sheet molding apparatus composed of a single-shaft kneading extruder, a T-die extrusion molding machine, and a winding machine connected together.

This fluorescent sheet was disposed on a solar cell panel, a transparent resin sheet as a protective sheet was further disposed on the fluorescent sheet, and thereby a solar power generation unit was configured.

When a solar power generation unit is configured as such, a wavelength conversion layer can be formed on the solar cell panel. It is preferable for such a wavelength conversion layer to have phosphor particles having a size of 0.1 μm to 100 μm dispersed in a transparent resin.

In regard to the solar power generation unit having such a configuration, when sunlight is irradiated from the upper side, sunlight is supplied to the fluorescent sheet through the transparent resin sheet. The phosphor that has received sunlight is excited by light having a wavelength of 250 nm to 610 nm, and particularly light having a wavelength of 300 nm to 510 nm in the sunlight, and emits light in the visible light region, and particularly red light so that the phosphor can supply the light to the solar cell panel. The solar cell panel receives light in the visible light region and is excited, and thus power generation can be carried out.

Meanwhile, it is also acceptable to form a film of the phosphor (powder) obtained in Example 2-2 on the above-mentioned transparent resin sheet by a physical deposition method, such as sputtering, electron beam deposition or the like of the phosphor on the transparent resin sheet. At that time, crystallinity can be increased by performing annealing after film formation.

Furthermore, instead of the polyether sulfone (PES), transparent thermoplastic resins such as polyallylate (PAR), polysulfone (PSF), polyether imide (PEI), polymethyl methacrylate (PMMA)-based resins, polycarbonate (PC)-based resins, and polystyrene (PS)-based resins; transparent thermosetting resins such as silicone-based resins and epoxy-based resins; and transparent ultraviolet (UV)-curable resins such as acrylic resins and urethane-based resins can be used. However, engineering plastics represented by polyether sulfone (PES) are preferred resins from the viewpoints of having excellent transparency and weather resistance.

Example 4

A phosphor composition was prepared by mixing the phosphor powder (red phosphor) obtained in Example 2-2 and a garnet-based yellow phosphor (compositional formula: $Y_3Al_5O_{12}{:}Ce$) containing activated Ce ions, at a mass ratio of 1:3, and the phosphor composition was added to the polyether sulfone (PES) at a mass proportion of 10 wt %. Thus, a phosphor sheet having a thickness of 100 μm was produced using a sheet molding apparatus composed of a single-screw kneading extruder, a T-die extrusion molding machine, and a winding machine connected together.

This phosphor sheet and a blue light emitting diode were combined, and thereby the light devices illustrated in FIG. 7 to FIG. 11 were produced.

That is, as illustrated in FIG. 7, a lighting device was produced by disposing light sources such as LED's along the end edges on both sides of the phosphor sheet.

Furthermore, as illustrated in FIG. 8, a lighting device was produced by disposing a light guiding plate on the back surface side (opposite side of the viewing side) of the phosphor sheet, and disposing light sources such as LED's on the flanks of this light guiding plate.

Furthermore, as illustrated in FIG. 9, a lighting device was produced by disposing a light guiding plate on the back surface side (opposite side of the viewing side) of the phosphor sheet, and disposing light sources such as LED's on the back surface side of this light guiding plate.

Furthermore, as illustrated in FIG. 10, a lighting device was produced by forming a sealing layer formed from a transparent resin composition, a glass composition, or an inorganic/organic mixed material obtained by mixing these compositions, such that the sealing layer surrounds the phosphor sheet, and disposing light sources such as LED's on the back surface side (opposite side of the viewing side) of the relevant sealing layer.

Furthermore, as illustrated in FIG. 11, a lighting device was produced by forming a sealing layer formed from a transparent resin composition or a glass composition into a dome shape that surrounds a light source such as an LED, molding the phosphor sheet using the dome-shaped form surrounding this sealing layer, and causing the phosphor sheet to surround the sealing layer.

Example 5

A phosphor composition was prepared by mixing the phosphor powder (red phosphor) obtained in Example 2-2 and a garnet-based yellow phosphor (compositional formula: $Y_3Al_5O_{12}$:Ce) containing activated Ce ions, at a mass ratio of 1:3, the phosphor composition was added to polyether sulfone (PES) at a mass proportion of 10 wt %, and thus a phosphor-containing resin composition was prepared.

As illustrated in FIG. 12, a phosphor molded body was formed, which had a configuration in which plural recessed grooves were provided at an interval on the back surface side of a sheet body formed from a transparent resin composition, the phosphor-containing resin composition was filled into the respective recessed grooves, and thus phosphor layers were formed.

Furthermore, as illustrated in FIG. 12, a lighting device was produced by disposing light sources such as LED's on the back surface side (opposite side of the viewing side) of the relevant phosphor molded body.

The invention claimed is:

1. A phosphor comprising a host material represented by compositional formula: $Ca_{1-x}Sr_xS \cdot yZnO$ (wherein $0 \leq x < 1$, and $0 < y \leq 0.5$) and a luminescent center, and also comprising a layer containing a $SiO_2$-containing amorphous oxide, wherein the host material contains a substance having a CaZnOS phase structure and the substance having a CaZnOS phase structure exists as particles containing a substance having a CaZnOS phase structure, or exists as a layer containing a substance having a CaZnOS phase structure, on the surface or in the vicinity of the surface of particles formed from a compound represented by formula: $Ca_{1-x}Sr_xS$ (wherein $0 \leq x < 1$).

2. The phosphor according to claim 1, wherein particles formed from a compound represented by $Ca_{1-x}Sr_xS$ (wherein $0 \leq x < 1$) and particles containing a substance having a CaZnOS phase structure are present in mixture and form aggregate particles.

3. The phosphor according to claim 1, wherein the host material contains a substance having a ZnS phase structure.

4. The phosphor according to claim 3, wherein the substance having a ZnS phase structure exists as particles containing a substance having a ZnS phase structure, or exists as a layer containing a substance having a ZnS phase structure.

5. The phosphor according to claim 1, comprising Eu as the luminescent center.

6. The phosphor according to claim 1, wherein the layer containing a $SiO_2$-containing amorphous oxide contains $B_2O_3$.

7. The phosphor according to claim 1, wherein the layer containing a $SiO_2$-containing amorphous oxide contains a fluoride compound containing one kind or two or more kinds selected from a group consisting of Ca, Sr, Ba, and Mg.

8. The phosphor according to claim 1, having a surface treated with an organic coupling agent.

9. A phosphor sheet presenting a sheet form, comprising the phosphor according to claim 1 and a transparent resin.

10. A phosphor molded body comprising a phosphor layer containing the phosphor according to claim 1, wherein the phosphor molded body is disposed within a sealing layer formed from a transparent resin composition or a glass composition.

11. An LED light-emission element, comprising a phosphor according to claim 1, a phosphor sheet comprising the phosphor and a transparent resin, or a phosphor molded body comprising a phosphor layer containing the phosphor, wherein the phosphor molded body is disposed within a sealing layer formed from a transparent resin composition or a glass composition, as a wavelength conversion material.

12. A light source device, having the LED light-emission element according to claim 11 mounted therein.

13. A solar power generation apparatus, comprising a phosphor according to claim 1, a phosphor sheet comprising the phosphor and a transparent resin, or a phosphor molded body comprising a phosphor layer containing the phosphor, wherein the phosphor molded body is disposed within a sealing layer formed from a transparent resin composition or a glass composition, which receives light including at least light in the ultraviolet region or light in the near-ultraviolet region in sunlight, and emit light in the visible light region; and a solar cell that receives light in the visible light region emitted by the phosphor, and converts the light to an electric signal.

14. The solar power generation apparatus according to claim 13, having a configuration in which the phosphor is applied on a light condensing surface or a heat collector pipe.

* * * * *